(12) United States Patent
Nakamura et al.

(10) Patent No.: US 12,123,924 B2
(45) Date of Patent: Oct. 22, 2024

(54) CIRCUIT ANOMALY DIAGNOSIS DEVICE, CURRENT GENERATION DEVICE, AIRCRAFT DEPLOYABLE BODY EJECTION DEVICE, AIRCRAFT AIRBAG DEVICE, AND AIRCRAFT CUTOFF DEVICE

(71) Applicant: NIPPON KAYAKU KABUSHIKI KAISHA, Tokyo (JP)

(72) Inventors: Hiroshi Nakamura, Tokyo (JP); Takuto Yoshioka, Tokyo (JP)

(*) Notice: Subject to any disclaimer, the term of this patent is extended or adjusted under 35 U.S.C. 154(b) by 209 days.

(21) Appl. No.: 17/758,010

(22) PCT Filed: Dec. 24, 2020

(86) PCT No.: PCT/JP2020/048585
§ 371 (c)(1),
(2) Date: Jun. 26, 2022

(87) PCT Pub. No.: WO2021/145191
PCT Pub. Date: Jul. 22, 2021

(65) Prior Publication Data
US 2023/0051789 A1  Feb. 16, 2023

(30) Foreign Application Priority Data
Jan. 15, 2020 (JP) .................................. 2020-004746

(51) Int. Cl.
*G01R 31/52* (2020.01)
*B64C 39/02* (2023.01)
(Continued)

(52) U.S. Cl.
CPC .............. *G01R 31/52* (2020.01); *B64C 39/02* (2013.01); *B64D 17/72* (2013.01); *B64D 25/00* (2013.01); *G01R 31/54* (2020.01)

(58) Field of Classification Search
CPC ...... G01R 31/52; G01R 31/008; G01R 31/54; B64D 25/00; B64D 17/72
(Continued)

(56) References Cited

U.S. PATENT DOCUMENTS 5,621,326 A * 4/1997 Watanabe ........... B60R 21/0173
324/502
6,182,807 B1   2/2001 Emoto
(Continued)

FOREIGN PATENT DOCUMENTS

JP        5985784 B2    9/2016
WO     2019/039062 A1   2/2019
(Continued)

OTHER PUBLICATIONS

ISR; Japan Patent Office; Tokyo; Mar. 2, 2021.
Supplementary European Search Report; Munich; Dec. 8, 2023.

*Primary Examiner* — Christopher E Mahoney
(74) *Attorney, Agent, or Firm* — Patshegen IP; Moshe Pinchas

(57) ABSTRACT

A circuit abnormality diagnosis device includes a calculation unit, an inspection power supply, a rectifier element, overcurrent preventing resistors and a voltage amplification unit, a voltage reading unit, and a light emitting unit. It performs a circuit abnormality diagnosis at a preset time (including the time of initial mounting) or every predetermined time. The device determines that a case where a voltage value is within a range of a first voltage value $V_1$ or more and a second voltage value $V_2$ or less, which is set in advance as a range of voltage values indicating that a circuit is normal, is a normal state, a case where the voltage value is less than the voltage value $V_1$ is a short-circuit state in which the circuit is short-circuited, and a case where the voltage value
(Continued)

is higher than the voltage value $V_2$ is a disconnection state which the circuit is disconnected.

10 Claims, 8 Drawing Sheets

(51) Int. Cl.
  *B64D 17/72* (2006.01)
  *B64D 25/00* (2006.01)
  *G01R 31/54* (2020.01)
(58) Field of Classification Search
  USPC .................................... 324/509; 244/100 A
  See application file for complete search history.

(56) References Cited

U.S. PATENT DOCUMENTS

| | | | |
|---|---|---|---|
| 8,979,023 B1 | 3/2015 | Wang | |
| 11,498,444 B1* | 11/2022 | Wiegman | B64C 39/04 |
| 2011/0215793 A1 | 9/2011 | Emoto | |
| 2012/0299599 A1 | 11/2012 | Naruse et al. | |
| 2015/0162747 A1 | 6/2015 | Iwasaki | |
| 2017/0313433 A1* | 11/2017 | Ozaki | B64D 27/24 |
| 2018/0233903 A1 | 8/2018 | Murakami et al. | |

FOREIGN PATENT DOCUMENTS

| | | |
|---|---|---|
| WO | 2019/078094 A1 | 4/2019 |
| WO | 2019/181989 A1 | 9/2019 |
| WO | 2019/189075 A1 | 10/2019 |

\* cited by examiner

CIRCUIT ANOMALY DIAGNOSIS DEVICE, CURRENT GENERATION DEVICE, AIRCRAFT DEPLOYABLE BODY EJECTION DEVICE, AIRCRAFT AIRBAG DEVICE, AND AIRCRAFT CUTOFF DEVICE

TECHNICAL FIELD

The present invention relates to a circuit abnormality diagnosis device, a current generating device including the circuit abnormality diagnosis device, a deployed object ejection device for a flight object including the current generating device, an airbag device for a flight object including the current generating device, and a cutting device for a flight object including the current generating device.

BACKGROUND ART

In recent years, industrial application of flight objects has been accelerating with the development of autonomous control technology and flight control technology. As described in Patent Literature 1 below, such flight objects include a safety mechanism in which a safety device (such as an airbag device) is deactivated by a safety signal during normal operation.

Note that when an igniter is used in a safety device in a flight object as described in Patent Literature 1 below, it is necessary to at least periodically diagnose whether there is an abnormality in circuits including a circuit for the igniter not only before operation but also during operation. Conventionally, an example of an abnormality diagnosis method for the circuit includes applying a predetermined voltage to the circuit, measuring a weak current flowing through the circuit (the current that would not cause the igniter to operate), determining whether the circuit is normal (whether there is a predetermined circuit resistance value), and confirming whether a connection failure (disconnection) occurs.

CITATIONS LIST

Patent Literature

Patent Literature 1: JP 5985784 B2

SUMMARY OF INVENTION

Technical Problems

However, in the above abnormality diagnosis method, when the accuracy of a current sensor is low because the weak current is measured, it is not possible to distinguish whether a short circuit has occurred in the circuit or the circuit is in a normal state. Further, in recent years, there has been a demand for a device capable of easily performing the abnormality diagnosis above with a simple device, instead of a highly accurate current sensor that costs relatively high for introduction.

Therefore, the present invention has been made in view of such circumstances, and an object of the present invention is to provide a circuit abnormality diagnosis device capable of simply and easily diagnosing a circuit abnormality without using a highly accurate current sensor that costs relatively high, a current generating device including the circuit abnormality diagnosis device, a deployed object ejection device for a flight object including the current generating device, an airbag device for a flight object including the current generating device, and a cutting device for a flight object including the current generating device.

Solutions to Problems (1) The present invention is a circuit abnormality diagnosis device that diagnoses a circuit abnormality in a safety device for a flight object including an igniter and a circuit connected to the igniter. The circuit abnormality diagnosis device includes: a power supply capable of loading a test voltage to the circuit; a calculation unit that controls on/off of the power supply; a first overcurrent prevention unit that is electrically connected in series to the power supply and prevents an overcurrent from flowing through the circuit; a voltage amplification unit that is electrically connected in parallel to the circuit unit and amplifies a voltage to a predetermined order; a voltage reading unit that is electrically connected in series to the voltage amplification unit and reads a value of the voltage amplified by the voltage amplification unit (hereinafter, the voltage value); and a second overcurrent prevention unit that is electrically connected in series to the voltage reading unit on an upstream side of the voltage reading unit and prevents an overcurrent from flowing. The calculation unit receives information on the voltage value from the voltage reading unit. The calculation unit determines that a case where the voltage value is within a range of a first voltage value $V_1$ or more and a second voltage value $V_2$ or less, which is set in advance as a range of voltage values indicating that the circuit is normal, is a normal state; a case where the voltage value is less than the voltage value $V_1$ is a short-circuit state in which the circuit is short-circuited; and a case where the voltage value is higher than the voltage value $V_2$ is a disconnection state in which the circuit is disconnected.

(2) From another viewpoint, the present invention is a circuit abnormality diagnosis device that diagnoses a circuit abnormality in a safety device for a flight object including an igniter and a circuit connected to the igniter. The circuit abnormality diagnosis device may include: a power supply capable of loading a test voltage to the circuit; a first overcurrent prevention unit that is electrically connected in series to the power supply and prevents an overcurrent from flowing through the circuit; a voltage amplification unit that is electrically connected in parallel to the circuit unit and amplifies a voltage; a calculation unit that controls a switch unit of the power supply, is electrically connected in series to the voltage amplification unit, and reads a value of the voltage amplified by the voltage amplification unit (hereinafter, the voltage value); and a second overcurrent prevention unit that is electrically connected in series to the voltage reading unit on an upstream side of the voltage reading unit and prevents an overcurrent from flowing. The calculation unit may determine that a case where the voltage value is within a range of a predetermined voltage value $V_1$ or more and $V_2$ or less, which is set in advance as a range of voltage values indicating that the circuit is normal, is a normal state; a case where the voltage value is less than the voltage value $V_1$ is a short-circuit state in which the circuit is short-circuited; and a case where the voltage value is higher than the voltage value $V_2$ is a disconnection state in which the circuit is disconnected.

(3) In the circuit abnormality diagnosis device of (1) or (2) above, it is preferable that a rectifier element that prevents a reverse current be electrically connected in series to a downstream side of the power supply and to an upstream side of the first overcurrent prevention unit.

(4) The circuit abnormality diagnosis devices of (1) to (3) above preferably receive information on a determination result of the abnormality diagnosis from the calculation unit, and when the information on the determination result is received from the calculation unit, the circuit abnormality diagnosis devices preferably include a light emitting unit capable of emitting a light of a color corresponding to each type of the information on the determination result.

(5) A current generating device of the present invention includes: the circuit abnormality diagnosis device according to any one of (1) to (4) above; a power storage unit; and a switch unit electrically connected to a downstream side of the power storage unit and capable of discharging a current stored in the power storage unit to the downstream side. The calculation unit transmits an operation signal of the discharge to the switch unit when it is determined that the flight object is in a flying state and the circuit is either in the short-circuit state or in the disconnection state.

(6) In the current generating device of (5) above, the power storage unit is preferably a capacitor.

(7) In the current generating device of (5) or (6) above, a physical switch unit that physically turns on/off electrical conduction between the circuit and the switch unit is preferably provided in the circuit.

(8) The present invention is a deployed object ejection device for a flight object mounted on the flight object, and the deployed object ejection device includes: the current generating device according to any one of (5) to (7) above; a deployed object; an igniter that operates when a current generated by operation of the current generating device is applied and produces a driving force for ejecting the deployed object; and a container that encloses the deployed object and the igniter.

(9) The present invention is an airbag device for a flight object mounted on the flight object, and the airbag device includes: the current generating device according to any one of (5) to (7) above; an airbag; a gas generator that includes an igniter and a gas generating agent and operates when a current generated by operation of the current generating device is applied to the igniter to burn the gas generating agent and generate a gas which inflates the airbag; and a container that encloses the airbag and the gas generator.

(10) The present invention is a cutting device for a flight object mounted on the flight object, and the cutting device includes: an electrical conduction unit or a coupling member; an igniter that operates when a current generated by operation of the current generating device is applied and generates heat or a driving force for cutting off the electrical conduction unit or the coupling member; and a drive cutting unit that receives the driving force to drive when the igniter generates the driving force.

Advantageous Effects of Invention

According to the present invention, it is possible to simply and easily diagnose a circuit abnormality without using a highly accurate current sensor that costs relatively high. Additionally, in a case where it is determined that the circuit is abnormal, a safety device (an ejection device, an airbag device, a cutting device, and others) for a flight object can be automatically actuated.

DESCRIPTION OF EMBODIMENTS

First Embodiment

Hereinafter, a first embodiment of the present invention will be described with reference to FIG. 1 to FIG. 3.

Figure 1:
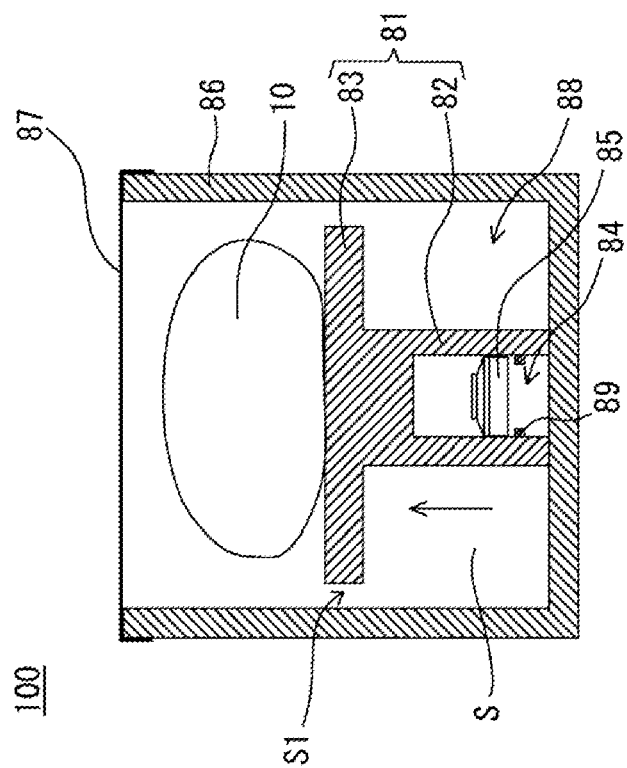
FIG. 1 is a cross-sectional view showing a deployed object ejection device for a flight object according to a first embodiment of the present invention.

As illustrated in FIG. 1, a deployed object ejection device for a flight object 100 includes an actuator 88 and a parachute or a paraglider 10 which is a deployed object.

The actuator 88 includes a gas generator 84 for a flight object having a cup-shaped case 85 for containing an ignition charge (not illustrated), a piston 81 having a recess portion 82 and a piston head 83 integrally formed with the recess portion 82, and a bottomed cylindrical housing 86 for containing the piston 81 and regulating a propulsion direction of the piston 81. The parachute or the paraglider 10 is housed in the housing 86 in a state of being arranged on the piston head 83. In such a configuration, the parachute or the paraglider 10 can be directly pushed out and deployed by the propulsion of the piston 81. Note that an opening end of the housing 86 is closed by a lid 87 in an initial state, and is detached from the opening end by extrusion of the parachute or the paraglider 10.

Further, as illustrated in FIG. 1, a communication portion S1 which is a gap (clearance) is formed between an inner wall of the housing 86 and an outer peripheral portion of the piston head 83. When the piston 81 moves (is ejected in the arrow direction of FIG. 1), a space S between the inner wall of the housing 86 and the piston head 83 has a negative pressure which can be reduced by air flowing into the space S from the communication portion S1, leading to a smooth movement of the piston 81.

The gas generator 84 is provided in the recess portion 82. A gas ejection port is provided at an end portion of the gas generator 84, and a gas can be generated as a propulsive force for ejecting the piston 81 in the arrow direction of FIG. 1 within the recess portion 82 by ignition via an electric signal. A seal member 89 such as an O-ring is provided between the recess portion 82 and an outer wall portion of the gas generator 84 to prevent gas leakage during operation.

Here, the gas generator 84 is small and light, and includes a cup body filled with a gas generating agent, an igniter 20 (not illustrated) for igniting the gas generating agent, and a holder for holding the igniter 20. Further, examples of the gas generator 84 include a micro gas generator, but any device which can generate a gas may be used. Note that the gas generating agent is a chemical agent (an explosive or a propellant) which is ignited by thermal particles generated by operation of the igniter 20 and generates a gas by burning.

Generally, the gas generator can be roughly classified into non-explosive and explosive types. In main non-explosive type gas generators, a sharp member such as a needle and a compressed spring are connected to a gas cylinder in which a gas such as carbon dioxide or nitrogen is sealed, and the sharp member is blown off using a spring force and collided with a sealing plate which seals the cylinder to release the gas. At this time, a drive source such as a servo motor is usually used to release the compressive force of the spring. Next, in explosive type gas generators, an igniter may be used solely, or an igniter and a gas generating agent may be provided. Further, a hybrid type or a stored type gas generator may be used which cleaves a sealing plate in a small gas cylinder by an explosive force and discharges an internal gas to the outside. In this case, a pressurized gas in the gas cylinder is selected from at least one or more of non-combustible gases such as argon, helium, nitrogen, and carbon dioxide. Additionally, when the pressurized gas is released, the gas generator may be provided with an explosive type heating element for reliable inflation. The gas generator may further include a filter or/and an orifice for adjusting a gas flow as needed.

As the gas generating agent, a non-azide gas generating agent is preferably used, and the gas generating agent is generally formed as a molded body containing a fuel, an oxidizing agent, and an additive. As the fuel, for example, a triazole derivative, a tetrazole derivative, a guanidine derivative, an azodicarbonamide derivative, a hydrazine derivative, or a combination thereof is used. Specific preferable examples include nitroguanidine, guanidine nitrate, cyanoguanidine, and 5-aminotetrazole. Further, examples of the oxidizing agent include a basic nitrate such as a basic copper nitrate, a perchlorate such as an ammonium perchlorate and a potassium perchlorate, and a nitrate containing a cation selected from an alkali metal, an alkaline earth metal, a transition metal, and ammonia. Preferable examples of the nitrate include a sodium nitrate and a potassium nitrate. In addition, examples of the additive include a binder, a slag forming agent, and a combustion regulator. Preferable examples of the binder include an organic binder such as a metal salt and a stearate of carboxymethyl cellulose, and an inorganic binder such as a synthetic hydroxytalcite and acid clay. Preferable examples of the slag forming agent include a silicon nitride, silica, and acid clay. Additionally, preferable examples of the combustion regulator include a metal oxide, ferrosilicon, activated carbon, and graphite. Additionally, a single base powder, a double base powder, and a triple base powder which contain nitrocellulose as a main component may be used.

In addition, examples of the shape of the molded body of the gas generating agent include a particle shape such as a granular shape, a pellet shape, and a cylindrical shape, and a disk-like shape. Further, as the cylindrical molded body, a perforated (for example, a single hole cylindrical or a porous cylindrical) molded body having a through hole inside the molded body may also be used. In addition to the shape of the gas generating agent, it is preferable to select a size and a filling amount of the molded body as appropriate in consideration of a linear burning rate, a pressure index, and the like of the gas generating agent.

The parachute or the paraglider 10 is connected to and housed in the housing 86 via a line (the coupling member) (not illustrated) such as a string member in a state of being arranged on the piston head 83. Further, an umbrella portion or a canopy (not illustrated) of the parachute or the paraglider 10 at a normal time (before being deployed), and the line (the coupling member) (not illustrated) are folded and housed in the housing 86 so as not to disturb the movement of the piston 81 during operation, and are deployed and used after being ejected from the inside of the housing 86 to the outside by actuation of the gas generator 84 which receives a predetermined signal (such as an abnormal signal generated when flight of a flight object 30 is in an abnormal state) from a control unit (not illustrated) of the flight object 30 in an emergency.

Figure 2:
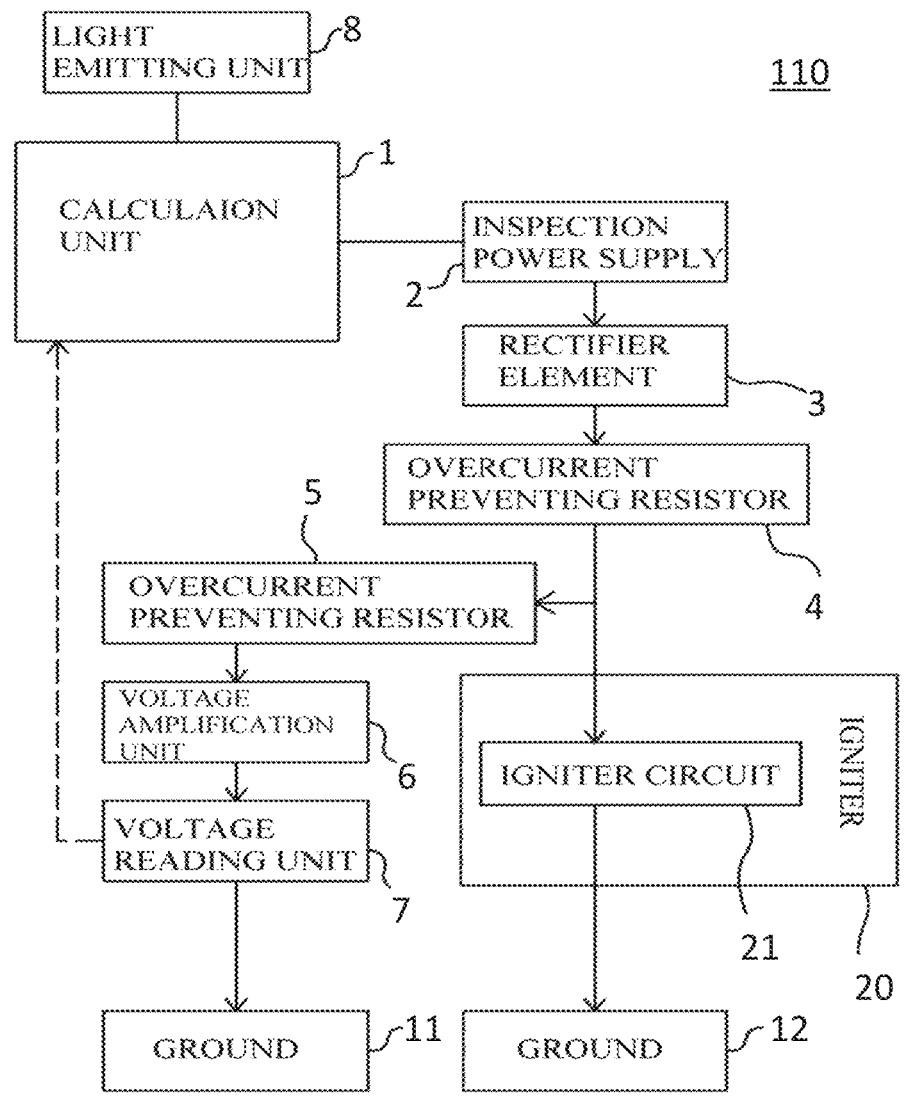
FIG. 2 is a block diagram showing a configuration of a circuit abnormality diagnosis device in the deployed object ejection device for a flight object of FIG. 1.

Also, the deployed object ejection device for a flight object 100 includes a circuit abnormality diagnosis device 110 not illustrated in FIG. 1, but illustrated in FIG. 2. The circuit abnormality diagnosis device 110 includes a calculation unit 1, an inspection power supply 2, a rectifier element 3, overcurrent preventing resistors 4 and 5, a voltage amplification unit 6, a voltage reading unit 7, and a light emitting unit 8, and performs a circuit abnormality diagnosis at a preset time (including the time of initial mounting) or every predetermined time. Here, an igniter circuit 21 of the igniter 20 connected to a ground 12 will be described as an example of a circuit whose abnormality is diagnosed.

The calculation unit 1 is, for example, a computer (not illustrated) including a CPU, a ROM, a RAM, and the like, and can automatically transmit a command signal, an operation signal, and the like to each unit according to a situation, or receive a command signal and the like from the outside via a communication unit (not illustrated) and transmit a command signal, an operation signal, and the like to each unit. For example, the calculation unit 1 transmits an operation signal for applying a predetermined voltage to the igniter circuit 21 to the inspection power supply 2 at a preset time (including the time of initial mounting) or every predetermined time.

Additionally, the calculation unit 1 determines that (1) a case where a voltage value is within a range of a predetermined voltage value $V_1$ or more and $V_2$ or less ($V_1$ to $V_2$) is a normal state, (2) a case where the voltage value is less than the voltage value $V_1$ is a short-circuit state in which the circuit is short-circuited, and (3) a case where the voltage value is higher than the voltage value $V_2$ is a disconnection state in which the circuit is disconnected, based on a voltage value (a digital signal) transmitted from the voltage reading unit 7 at a preset time (including the time of initial mounting) or every predetermined time.

Note that for the range of the voltage values $V_1$ to $V_2$, the voltage values of the igniter circuits 21 of a plurality of the igniters 20 before mounting are actually measured in advance, and a voltage value corresponding to a case where the igniter circuit 21 has a normal resistance value is set as a voltage value in the normal state, and the calculation unit 1 performs an abnormality diagnosis of the igniter circuit 21 based on information on the voltage value.

The inspection power supply 2 applies a voltage of a predetermined value (for example, 3.3 V) to a downstream side by receiving the operation signal from the calculation unit 1.

The rectifier element 3 prevents a reverse current, and is electrically connected in series to the downstream side of the inspection power supply 2. Additionally, the rectifier element 3 is connected to an upstream side of the overcurrent preventing resistor 4.

The overcurrent preventing resistor 4 is a resistor (for example, 300Ω) which prevents an overcurrent from flowing through the igniter circuit 21 of the igniter 20, and is electrically connected in series to a downstream side of the rectifier element 3. Further, the overcurrent preventing resistor 4 is connected to an upstream side of the igniter circuit 21. Note that the overcurrent preventing resistor 4 can prevent the igniter 20 from operating during the abnormality diagnosis.

The overcurrent preventing resistor 5 is a resistor (for example, 10 kΩ) which prevents an overcurrent from flowing through the voltage reading unit 7, and is electrically connected in parallel to the igniter circuit 21. Further, the overcurrent preventing resistor 5 is electrically connected in series to an upstream side of the voltage amplification unit 6. Note that the overcurrent preventing resistor 5 can prevent failure of the voltage reading unit 7 due to an overcurrent during the abnormality diagnosis.

The voltage amplification unit 6 amplifies the applied voltage (for example, an operational amplifier), and is electrically connected in series to a downstream side of the overcurrent preventing resistor 5. Additionally, a downstream side of the voltage amplification unit 6 is electrically connected in series to the voltage reading unit 7.

The voltage reading unit 7 is a voltmeter or the like that reads the applied voltage, and is electrically connected in series to the downstream side of the voltage amplification unit 6. Further, a downstream side of the voltage reading unit 7 is connected to a ground 11. Note that the voltage reading unit 7 converts a measured voltage value (an analog amount) into a digital signal and transmits the digital signal to the calculation unit 1.

The light emitting unit 8 receives information on a result of the abnormality diagnosis determined by the calculation unit 1, and causes an LED or the like to emit a light using a power supply so as to correspond to each type of the information on the determined result of the abnormality diagnosis. For example, a light emission state of each LED is controlled such that when the information on the result of the abnormality diagnosis received from the calculation unit 1 is information of the normal state, a normal signal is transmitted to cause a green LED to emit a light, when the information is information of the short-circuit state, a short-circuit signal is transmitted to cause a yellow LED to emit a light, and when the information is information of the disconnection state, a disconnection signal is transmitted to cause a red LED to emit a light.

Here, a specific example of a case where the calculation unit 1 having 8-bit processing performance reads a voltage with a reading accuracy of a resistance value of the igniter circuit 21 set to 0.1Ω will be described. For example, when a state in which a value of circuit resistance of the igniter circuit 21 is 1 Ω to 10Ω, using an amplification factor of the voltage amplification unit 6 of 10 times, a resistance of 300Ω for the overcurrent preventing resistor 4, and a resistance of any value of 300 Ω to 1000Ω for the overcurrent preventing resistor 5, is the normal state, the voltage value of 0.1 V to 1.1 V in the corresponding range is treated as a voltage value in the normal state, the voltage value of less than 0.1 V corresponding to a case where the resistance value of the circuit is less than 1Ω is treated as a voltage value in the short-circuit state, and the voltage value of more than 1.1 V corresponding to a case where the resistance value of the circuit exceeds 10Ω is treated as a voltage value in the disconnection state.

Here, the reason will be shown why in the configuration of the example above, the state in which the circuit resistance value of the igniter circuit 21 is 1 Ω to 10Ω is the normal state, the state in which the circuit resistance value of the igniter circuit 21 is less than 1Ω is the short-circuit state, and the state in which the circuit resistance value of the igniter circuit 21 is more than 10 Ω is the disconnection state.

In the configuration of the example above, the circuit resistance value of the igniter circuit 21 in the normal state is any value of 1.0 Ω to 6.7Ω in a case where a resistance value of the igniter 20 is designed as 1.0 Ω to 3.0Ω, a resistance of a connector connecting the igniter 20 to the igniter circuit 21 is designed as 0.0 Ω to 0.1Ω, and a conductive wire resistance (maximum 100 m) is designed as 0.0 Ω to 3.6Ω in consideration of variations in values. Accordingly, if the igniter circuit 21 is in the short-circuit state, the circuit resistance value of the igniter circuit 21 is less than 1.0Ω. Additionally, if the igniter circuit 21 is in the disconnection state, the circuit resistance value of the igniter circuit 21 exceeds 6.7Ω, but a case where the circuit resistance value exceeds 10Ω with a margin is set as the disconnection state. In this way, the state in which the circuit resistance value of the igniter circuit 21 is 1Ω to 10Ω is set as the normal state, the state in which the circuit resistance value of the igniter circuit 21 is less than 1Ω is set as the short-circuit state, and the state in which the circuit resistance value of the igniter circuit 21 is more than 10Ω is set as the disconnection state.

Note that when a measurement error of the igniter circuit 21 is corrected to be, for example, the maximum error of ±6%, the circuit resistance value of the igniter circuit 21 in the normal state falls within a range of 0.9 Ω to 7.2Ω. Accordingly, when considering the measurement error of the igniter circuit 21, a state in which the circuit resistance value of the igniter circuit 21 is 0.9 Ω to 10Ω with a margin may be set as the normal state, a state in which the circuit resistance value of the igniter circuit 21 is less than 0.9Ω may be set as the short-circuit state, and a state in which the circuit resistance value of the igniter circuit 21 is more than 10Ω may be set as the disconnection state.

As described above, the normal state, the short-circuit state, and the disconnection state can be set in advance for the circuit resistance values of the igniter circuit 21 in consideration of the design. Then, voltages corresponding to these circuit resistance values are set respectively, and the circuit state of the igniter circuit 21 is diagnosed by measuring the voltage of the igniter circuit 21.

Further, in the circuit abnormality diagnosis device 110, increasing the reading accuracy of the resistance value of the igniter circuit 21 can be achieved by increasing the bit number of the calculation unit 1 (increasing processing capability) or decreasing the resistance value of the overcurrent preventing resistor 4.

Figure 3:
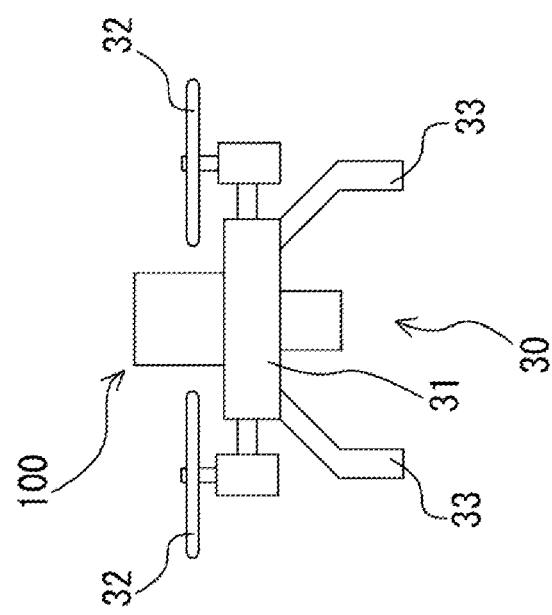
FIG. 3 is a front view showing a flight object to which the deployed object ejection device for a flight object of FIG. 1 is applied.

FIG. 3 illustrates the flight object 30 to which the deployed object ejection device for a flight object 100 is applied. The flight object 30 includes a fuselage 31, the deployed object ejection device for a flight object 100 coupled to the fuselage 31, one or more propulsion mechanisms (for example, propellers) 32 coupled to the fuselage 31 and configured to propel the fuselage 31, and a plurality of legs 33 provided in a lower portion of the fuselage 31.

Next, operation of the circuit abnormality diagnosis device 110 of the deployed object ejection device for a flight object 100 will be described. First, the calculation unit 1 transmits an operation signal for applying a predetermined voltage to the igniter circuit 21 to the inspection power supply 2 at a preset time (including the time of initial mounting) or every predetermined time. An inspection power supply 102 that has received the operation signal applies the predetermined voltage to the igniter circuit 21 via a rectifier element 103 and the overcurrent preventing resistor 4 on a downstream side. At this time, the predetermined voltage is also applied to the overcurrent preventing resistor 5 via the rectifier element 103 and the overcurrent preventing resistor 4. Then, after the voltage applied via the overcurrent preventing resistor 5 is amplified by the voltage amplification unit 6, the voltage reading unit 7 reads a value of the amplified voltage (the voltage value). The voltage value read by the voltage reading unit 7 is converted into a digital signal and then transmitted to the calculation unit 1.

Subsequently, the calculation unit 1 diagnoses (determines) whether the igniter circuit 21 is in the normal state, the short-circuit state, or the disconnection state based on the received digital signal of the voltage value. When the calculation unit 1 diagnoses (determines) that the igniter circuit 21 is in the normal state, the calculation unit 1 transmits the normal signal to the light emitting unit 8. The light emitting unit that has received the normal signal causes the green LED to emit a light. On the other hand, the calculation unit 1 diagnoses (determines) that the igniter circuit 21 is in the short-circuit state, the calculation unit 1 transmits the short-circuit signal to the light emitting unit 8. The light emitting unit that has received the short-circuit signal causes the yellow LED to emit a light. In addition, the calculation unit 1 diagnoses (determines) that the igniter circuit 21 is in the disconnection state, the calculation unit 1 transmits the disconnection signal to the light emitting unit 8. The light emitting unit that has received the disconnection signal causes the red LED to emit a light.

In the flight object 30 to which the deployed object ejection device for a flight object 100 configured as described above is applied, the abnormality diagnosis of the igniter circuit 21 can be simply and easily performed by using a voltage drop characteristic generated when the circuit resistance value decreases without using a highly accurate current sensor that costs high.

Additionally, the light emitting unit 8 can easily notify the outside of the devise whether the result of the abnormality diagnosis of the igniter circuit 21 is the normal state, the short-circuit state, or the disconnection state.

Second Embodiment

Figure 4:
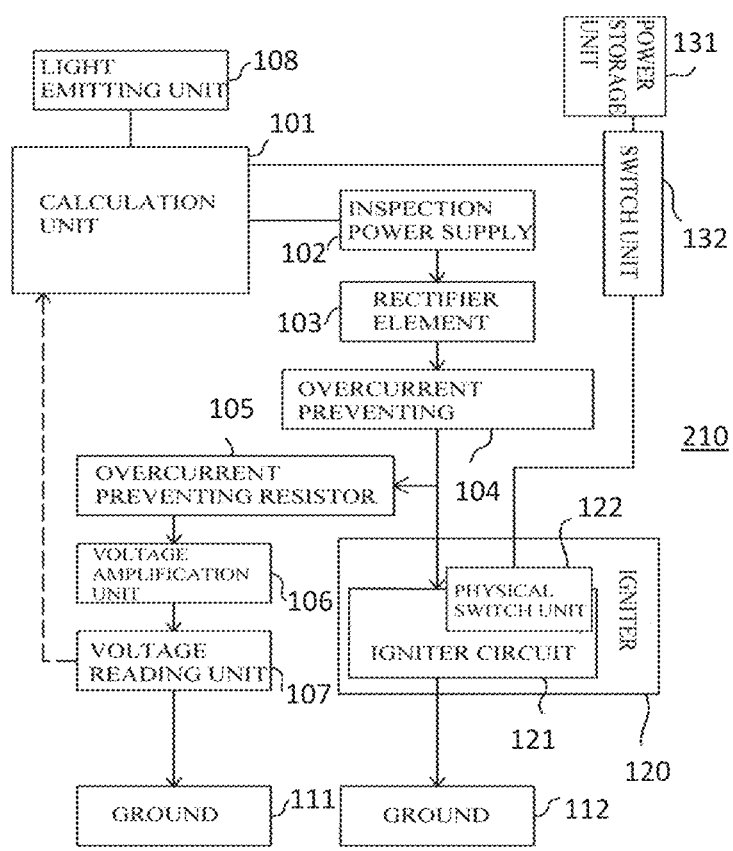
FIG. 4 is a block diagram showing a configuration of a current generating device in a deployed object ejection device for a flight object according to a second embodiment of the present invention.

Next, a second embodiment of the present invention will be described with reference to FIG. 4 and FIG. 5. Note that in the present embodiment, parts having the same reference numerals as those in the first embodiment up to the last two digits are the same as the parts in the first embodiment, and thus descriptions thereof may be omitted.

A deployed object ejection device for a flight object (not illustrated) according to the present embodiment can be applied to the same flight object (not illustrated) as the flight object 30 of the first embodiment, instead of the deployed object ejection device for a flight object 100 of the first embodiment. Further, as illustrated in FIG. 4, the deployed object ejection device for a flight object according to the present embodiment includes substantially the same circuit abnormality diagnosis device 210 as that of the first embodiment, but is different from that of the first embodiment in including a power storage unit 131, a switch unit 132, and a physical switch unit 122 provided in an igniter circuit 121.

The power storage unit 131 has a power storage function like a capacitor, and can discharge electricity as needed. Further, a downstream side of the power storage unit 131 is electrically connected in series with the switch unit 132.

Note that the power storage unit 131 stores power in advance before operation of the deployed object ejection device for a flight object 200.

The switch unit 132 is electrically connected to the downstream side of the power storage unit 131, and is electrically connected in series to the physical switch unit 122 on a downstream side. In addition, when receiving an ON signal from a calculation unit 101, the switch unit 132 turns on a switch function, and a stored current is discharged from the power storage unit 131 to a physical switch unit 122 side.

The physical switch unit 122 prevents a current from flowing through the igniter circuit 121 when operation is not required, for example, during transportation. Examples of the physical switch unit 122 include those illustrated in FIG. 5. The physical switch unit 122 in FIG. 5 will be described below.

Figure 5:
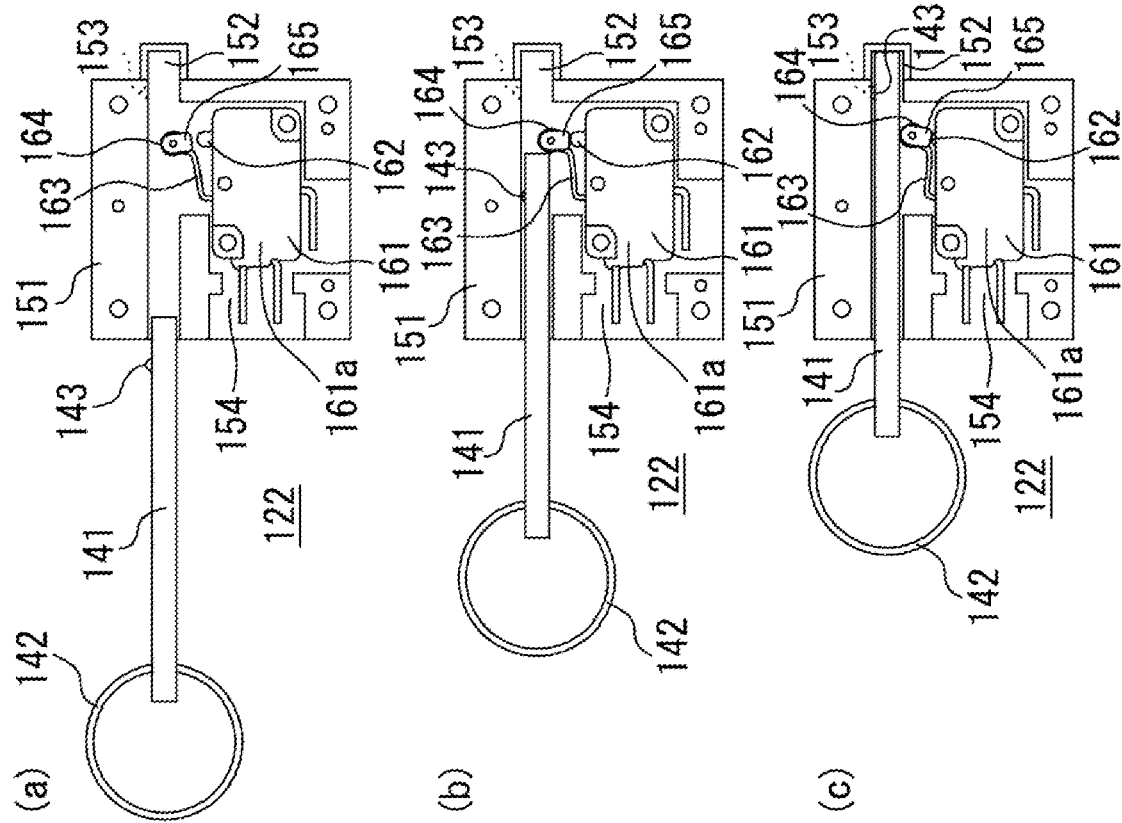
FIG. 5 is a diagram showing an example of a physical switch unit in FIG. 4.

The physical switch unit 122 in FIG. 5 includes a main body portion 151, a pin portion 141, and a switch mechanism 161.

The main body portion 151 includes a tubular portion 152 into which a long rod-shaped pin portion 141 is inserted, a recess portion 153 into which a ball portion of a ball lock mechanism 143 provided at a predetermined position from a tip end of the pin portion 141 fits, and a space 154 in which the switch mechanism 161 is fixedly disposed.

As illustrated in FIG. 5(a), a part in the middle of the tubular portion 152 and a part of the space 154 are communicated with each other, and in the communicated space, a portion including a leaf spring 163, a roll portion 164, and a pressing portion 165 of the switch mechanism 161 is in a state of being movable within a predetermined range around one end side of the leaf spring 163 (a main body side of the switch mechanism 161) as an axis.

The pin portion 141 includes a ring-shaped member 142 provided near one end portion and the ball lock mechanism 143 provided at a predetermined position from the tip end of the other end portion.

In the ball lock mechanism 143, a spring (not illustrated) is provided inside a recess portion provided in the pin portion 141, and biases the ball portion provided in a state of not protruding from the recess portion toward the outside. Accordingly, in the state of FIG. 5(a), the ball lock mechanism 143 is in a state in which the ball portion protrudes most from the pin portion 141; in the state of FIG. 5(b), the ball lock mechanism 143 is pushed by the tubular portion 152 to be recessed in and enter the pin portion 141; and in the state of FIG. 5(c), the ball lock mechanism 143 is in a state in which the ball portion protrudes from the pin portion 141 and fits into the recess portion 153. Therefore, in the state of FIG. 5(c), the pin portion 141 is temporarily fixed to the main body portion 151, and cannot be easily removed.

The switch mechanism 161 includes a main body 161a, an on/off switch unit 162, the leaf spring 163, the roll portion 164, and the pressing portion 165.

The on/off switch unit 162 is provided with a spring (not illustrated) having a biasing force from the inside of the switch mechanism 161 to the outside, and can be depressed by being pressed by the pressing portion 165 as shown in FIG. 5(a) of the protruding state, FIG. 5(b), and FIG. 5(c) in this order. In addition, the on/off switch unit 162 is in an on state (an electrical conduction state) when in the protruding state of FIG. 5(a), and is in an off state (an electrical disconnection state) when in the state shown in FIG. 5(c).

One end portion of the leaf spring 163 is fixed to the main body 161a of the switch mechanism 161, and the other end portion is movable within a predetermined range. Additionally, at the other end portion of the leaf spring 163, the roll portion 164 is rotatably and pivotally supported, and a pressing portion 165 is provided.

Since the roll portion 164 is rotatably and pivotally supported by the other end portion of the leaf spring 163, as illustrated in FIG. 5(b), the roll portion 164 rotates to reduce friction generated when the tip end of the pin portion 141 abuts on the roll portion 164. Accordingly, the pin portion 141 can be smoothly inserted into the tubular portion 152. Further, certainly, the pin portion 141 can also be smoothly taken out from the tubular portion 152.

According to the physical switch unit 122, the following operation can be performed in the present embodiment. For example, in a case where the flight object is flying with the physical switch unit 122 on, an operation signal is transmitted from the calculation unit 101 when the calculation unit 101 diagnoses (determines) that the igniter circuit 121 is in an abnormal state (a short-circuit state or a disconnection state), and the switch unit 132 that has received the operation signal discharges the current from the power storage unit 131. The current is applied to the igniter circuit 121 via the physical switch unit 122 to start an igniter 120. Accordingly, after a parachute or a paraglider is ejected from the inside to the outside of a housing of the same ejection device as that of the first embodiment, the parachute or the paraglider is deployed.

In the flight object to which the deployed object ejection device for a flight object 200 configured as described above is applied, the same effects as those of the first embodiment can be produced.

Further, according to the present embodiment, by keeping the physical switch unit 122 off in a state where the flight object is not used, for example, during transportation, operation due to a malfunction (unintended energization of an operating current) of the igniter can be prevented. Additionally, since the pin portion 141 is temporarily fixed to the main body portion 151 by the ball lock mechanism, the pin portion 141 is not be easily removed, and the operation due to the malfunction (unintended energization of an operating current) of the igniter can be further prevented.

Further, according to the present embodiment, for example, in a case where the flight object is flying with the physical switch unit 122 on, the igniter 120 is actuated when it is diagnosed (determined) that the igniter circuit 121 is in the abnormal state (the short-circuit state or the disconnection state), and the parachute or the paraglider can be deployed after the parachute or the paraglider is ejected from the inside to the outside of the housing of the same ejection device as that of the first embodiment by a gas generator. Consequently, the flight object can be protected before an abnormality occurs in a portion other than an igniter circuit of the igniter circuit 121. In other words, when an abnormality occurs in the portion other than the igniter circuit, it is possible to prevent a situation in which an abnormality also occurs in the igniter circuit and the deployed object ejection device for a flight object does not operate.

Third Embodiment

Figure 6:
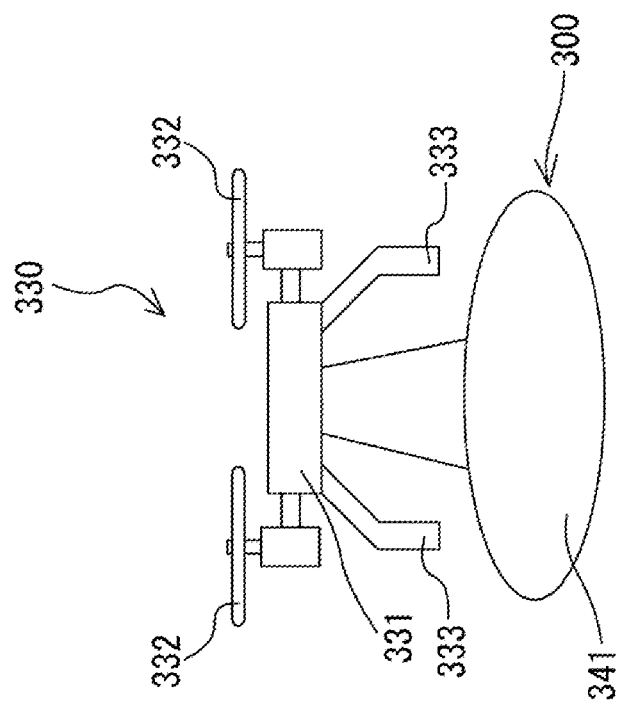
FIG. 6 is a front view showing a state after operation of a flight object to which an airbag device for a flight object according to a third embodiment of the present invention is applied.

Next, a third embodiment of the present invention will be described with reference to FIG. 6. Note that in the present embodiment, parts having the same reference numerals as those in the first embodiment up to the last two digits are the same as the parts in the first embodiment, and thus descriptions thereof may be omitted. Further, in the present embodiment, the same part names as those in the second embodiment are used for the same parts as those in the second embodiment, and descriptions thereof may be omitted.

An airbag device for a flight object 300 according to the present embodiment can be applied to the same flight object (not illustrated) as the flight object 30 of the first embodiment. Further, the airbag device for a flight object 300 according to the present embodiment includes the same circuit abnormality diagnosis device as that of the second embodiment, and is the same as that of the second embodiment except that an igniter (not illustrated) in the present embodiment is provided in a gas generator (not illustrated) that generates a gas to inflate an airbag 341. Details will be described below.

A flight object 330 includes the airbag device for a flight object 300 that inflates the airbag 341 by a gas pressure generated based on operation of the same gas generator (not illustrated) as the gas generator of the first embodiment. Note that the airbag 341 and the gas generator before deployment (device actuation) are in a state of being accommodated in a container (not illustrated), and in this state, the airbag device for a flight object 300 is provided at a lower portion of a fuselage 331 in the normal attitude shown in FIG. 6.

A calculation unit of the airbag device for a flight object 300 according to the present embodiment diagnoses (determines) a state of an igniter circuit by the same circuit abnormality diagnosis device as that of the second embodiment.

According to the airbag device for a flight object 300, the following operation can be performed in the present embodiment. For example, in a case where the flight object is flying with a physical switch unit on, an operation signal is transmitted from the calculation unit when the calculation unit diagnoses (determines) that the igniter circuit is in an abnormal state (a short-circuit state or a disconnection state), and the switch unit that has received the operation signal discharges a current from a power storage unit. The current is applied to the igniter circuit via the physical switch unit, a gas generating agent is combusted by starting the igniter, and the airbag 341 is inflated and deployed by the generated gas.

In the flight object to which the airbag device for a flight object 300 configured as described above is applied, the same effects as those of the first embodiment can be produced.

Further, according to the present embodiment, for example, in a case where the flight object is flying with the physical switch unit 122 on, the airbag 341 can be deployed after the igniter is actuated and the airbag 341 is inflated by the gas generator when it is diagnosed (determined) that the igniter circuit is in an abnormal state (a short-circuit state or a disconnection state). Consequently, the flight object can be protected before an abnormality occurs in a portion other than the igniter circuit. In other words, when an abnormality occurs in the portion other than the igniter circuit, it is possible to prevent a situation in which an abnormality also occurs in the igniter circuit and the airbag device for a flight object 300 does not operates.

Fourth Embodiment

Next, a fourth embodiment of the present invention will be described with reference to FIG. 7 and FIG. 8. Note that in the present embodiment, parts having the same reference numerals as those in the first embodiment up to the last two digits are the same as the parts in the first embodiment, and thus descriptions thereof may be omitted. Further, in the present embodiment, the same part names as those in the second embodiment are used for the same parts as those in the second embodiment, and descriptions thereof may be omitted.

Figure 7:
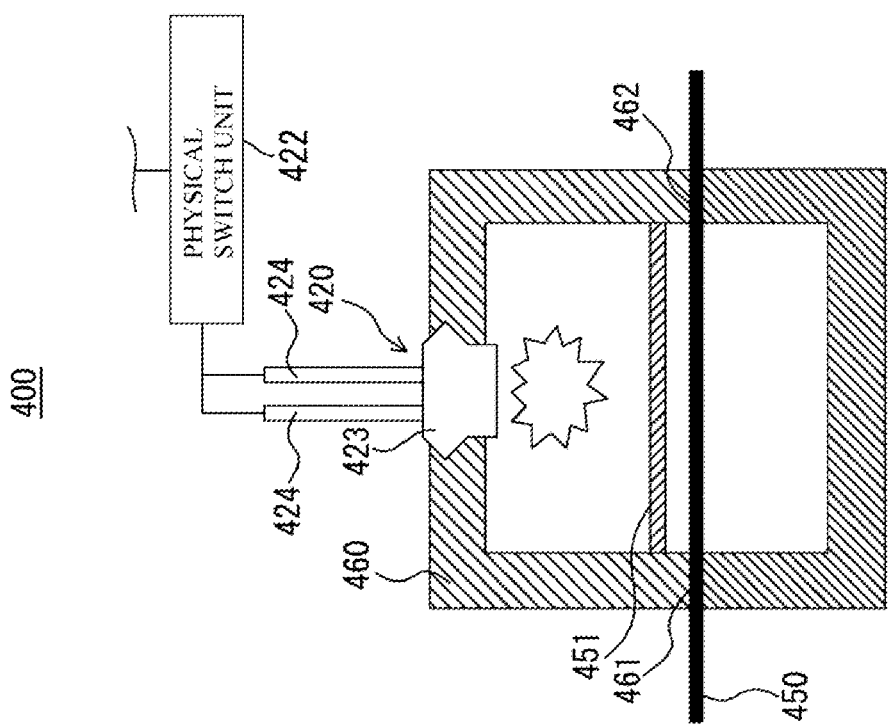
FIG. 7 is a cross-sectional view showing a cutting device for a flight object according to a fourth embodiment of the present invention.
Figure 8:
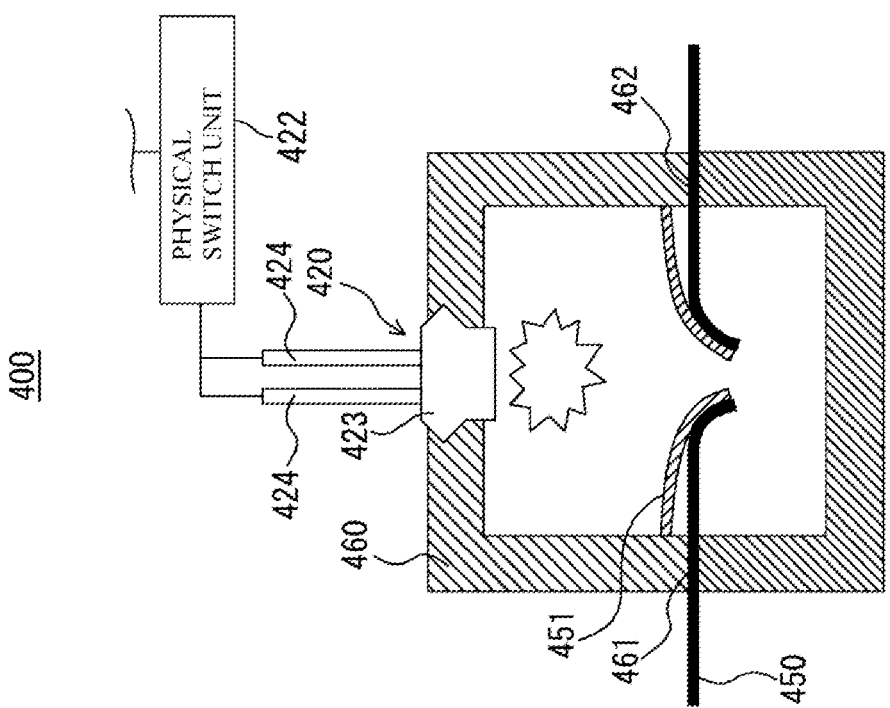
FIG. 8 is a cross-sectional view showing the cutting device for a flight object of FIG. 7 after operation.

As illustrated in FIG. 7, a cutting device for a flight object 400 according to the present embodiment can be applied to the same flight object (not illustrated) as the flight object 30 of the first embodiment. Further, the cutting device for a flight object 400 according to the present embodiment includes the same circuit abnormality diagnosis device as that of the second embodiment, and is the same as that of the second embodiment except that an igniter 420 according to the present embodiment cuts (breaks) a current supply path 450. Details will be described below.

The cutting device for a flight object 400 includes the igniter 420 which is an example of a destructive source (a power source), a cutting chamber 460 having an internal space, a rupture plate 451 which is damaged and cleaved by application of heat and pressure generated by operation of the igniter 420 and cuts the current supply path 450, and the same physical switch unit 422 as that of the second embodiment.

The igniter 420 generates flame, and includes an ignition unit 423 internally including an ignition charge (not illustrated) that ignites and burns during operation to generate flame and a resistor (not illustrated) for igniting the ignition charge, and a pair of terminal pins 424, 424 connected to the ignition unit 423. Note that the pair of terminal pins 424, 424 is also a part of an igniter circuit.

The rupture plate 451 is formed in, for example, a circular shape in plan view, and is provided in the cutting chamber 460 and below the igniter 420. Since the rupture plate 451 is easily cleaved and requires an appropriate strength, it can be made of a lightweight metal such as iron and aluminum. Further, the rupture plate 451 may be made of a non-conductive material, for example, a hard resin material such as ebonite, or fine ceramics. The rupture plate 451 has a width larger than the width of the igniter 420 in the length direction of the current supply path 450. The igniter 420 is held on an upper wall of the cutting chamber 460 so that the generated flame can be emitted toward the rupture plate 451 located below.

For example, in a case where the flight object is flying with the physical switch unit 422 on, an operation signal is transmitted from a calculation unit when the calculation unit diagnoses (determines) that the igniter circuit is in an abnormal state (a short-circuit state or a disconnection state), and the switch unit that has received the operation signal discharges a current from a power storage unit. A predetermined amount of the current flows to the resistor via the physical switch unit 422 and the pair of terminal pins 424, 424. When the current flows through the resistor, Joule heat is generated in the resistor, and the ignition charge starts combustion. The hot flame resulting from the combustion ruptures a squib cup (not illustrated) containing the ignition charge. In the igniter 420, the time from when the current flows through the resistor to when the resistor is actuated is generally 2 milliseconds or less in a case where a nichrome wire is used for the resistor.

A through hole 461 is provided in a peripheral wall of the cutting chamber 460, and a through hole 462 is provided in another portion of the peripheral wall. The current supply path 450 is bridged through the through holes 461 and 462. The current supply path 450 is made of, for example, a metal plate or a metal wire, and has one end connected to a storage battery (not illustrated) of an electric circuit and the other end connected to an electrical device (not illustrated) of the flight object.

In the configuration as described above, in a case where the flight object is flying with the physical switch unit 422 on when an abnormality of the flight object is detected, the rupture plate 451 is damaged by heat and pressure generated by operation of the igniter 420 when a predetermined amount of the current is supplied to the pair of terminal pins 424, 424 of the igniter 420 in a case where the calculation unit diagnoses (determines) that the igniter circuit is in the abnormal state (the short-circuit state or the disconnection state). In this case, the rupture plate 451 is damaged such that a central portion thereof is cleaved and bent toward the current supply path 450. Then, the current supply path 450 is cut as in FIG. 8 by the rupture plate 451 damaged as described above. Note that in the present invention, a target of the current supply path 450 to be cut off is desirably a wiring from a positive electrode portion.

In this way, according to the cutting device for a flight object 400 of the present embodiment, for example, when the flight object is flying with the physical switch unit 122 on and it is diagnosed (determined) that the igniter circuit is in the abnormal state (the short-circuit state or the disconnection state), the igniter 420 is actuated as a destructive source. The igniter 420 applies heat and pressure toward the current supply path 450 to the rupture plate 451. As a result, the rupture plate 451 can be damaged and cleaved, and the current supply path 450 can be cut by a cleaved portion of the cleaved rupture plate 451. Accordingly, the current supply to the electrical device of the flight object can be cut off. Consequently, it is possible to prevent occurrence of a contact accident between a part such as an operating propeller and a person, fire, or an electric shock when the flight object crashes. Additionally, when a part of the propeller stops, the flight is normally maintained by controlling the rotation speed of another propeller, but in this case, a load on a motor is excessively applied and thus causes failure. However, since the current supply can be forcibly cut off as described above, the motor failure can be avoided.

Although the embodiments of the present invention have been described above, they are merely specific examples and do not particularly limit the present invention, and the specific configurations can be modified in design as appropriate. In addition, the actions and effects described in the embodiments of the invention are merely the most suitable actions and effects resulting from the present invention, and the actions and effects according to the present invention are not limited thereto.

For example, in each of the above embodiments, the igniter circuit of the igniter has been described as an example of the circuit whose abnormality is diagnosed, but a target circuit of the abnormality diagnosis is not limited thereto. For example, an abnormality diagnosis of a circuit related to the ejection device other than the igniter circuit may be performed.

In addition, the calculation unit in each of the above embodiments may also have the function of the voltage reading unit. At this time, the calculation unit is electrically connected to the ground.

Further in the pin portion 141 in the second embodiment, the end portion may be tapered. Accordingly, the tapered shape makes it easier to rotate a roller portion, and thus, the pin portion 141 can be inserted more smoothly.

Further, in the fourth embodiment, the current supply path is cut, but the present invention is not limited to the one exemplified. For example, there may be a situation where it is desirable to cut a line connected to the parachute or the paraglider after deployment. In such a situation, the line may be burned off by flame of the igniter, or may be cut by operating a cutting means such as a cutter using a flame force of the igniter.

Further, the present invention may be a flight object formed by appropriately combining each the above embodiments and modifications.

REFERENCE SIGNS LIST 1, 101 calculation unit
2, 102 inspection power supply
3, 103 rectifier element
4, 5, 104, 105 overcurrent preventing resistor
6, 106 voltage amplification unit
7, 107 voltage reading unit
8, 108 light emitting unit
10 paraglider
11, 12, 111, 112 ground
20, 120, 420 igniter
21, 121 igniter circuit
30, 330 flight object
31, 331 fuselage
32, 332 propulsion mechanism
33, 333 leg
81 piston
82, 153 recess portion
83 piston head
84 gas generator
85 case
86 housing
87 lid
88 actuator
89 seal member
100, 200 deployed object ejection device for a flight object
110, 210 circuit abnormality diagnosis device
122, 422 physical switch unit
131 power storage unit
132 switch unit
141 pin portion
142 ring-shaped member
143 ball lock mechanism
151 main body portion
152 tubular portion
154 space
161 switch mechanism
161a main body
162 off switch unit
163 leaf spring
164 roll portion
165 pressing portion
300 airbag device for a flight object
341 airbag
400 cutting device for a flight object
423 ignition unit
424 terminal pin
450 current supply path
451 rupture plate
460 cutting chamber
461, 462 through hole
S space
S1 communication unit

The invention claimed is:

1. A circuit abnormality diagnosis device that diagnoses a circuit abnormality in a safety device for a flight object including an igniter and a circuit connected to the igniter, the circuit abnormality diagnosis device comprising:
a power supply capable of loading a test voltage to the circuit;
a calculation unit that controls on/off of the power supply;
a first overcurrent prevention unit that is electrically connected in series to the power supply and prevents an overcurrent from flowing through the circuit;
a voltage amplification unit that is electrically connected in parallel to the circuit and amplifies a voltage to a predetermined order;
a voltage reading unit that is electrically connected in series to the voltage amplification unit and reads a value of the voltage amplified by the voltage amplification unit (hereinafter, the voltage value); and
a second overcurrent prevention unit that is electrically connected in series to the voltage reading unit on an upstream side of the voltage reading unit and prevents an overcurrent from flowing,
wherein the calculation unit receives information on the voltage value from the voltage reading unit, and determines that a case where the voltage value is within a range of a first voltage value $V_1$ or more and a second voltage value $V_2$ or less, which is set in advance as a range of voltage values indicating that the circuit is normal, is a normal state;
a case where the voltage value is less than the voltage value $V_1$ is a short-circuit state in which the circuit is short-circuited; and
a case where the voltage value is higher than the voltage value $V_2$ is a disconnection state in which the circuit is disconnected.

2. The circuit abnormality diagnosis device according to claim 1, wherein a rectifier element that prevents a reverse current is electrically connected in series to a downstream side of the power supply and to an upstream side of the first overcurrent prevention unit.

3. The circuit abnormality diagnosis device according to claim 1, wherein the circuit abnormality diagnosis device receives information on a determination result of the abnormality diagnosis from the calculation unit, and when the information on the determination result is received from the calculation unit, the circuit abnormality diagnosis device includes a light emitting unit capable of emitting a light of a color corresponding to each type of the information on the determination result.

4. A current generating device comprising:
the circuit abnormality diagnosis device according to claim 1,
a power storage unit; and
a switch unit electrically connected to a downstream side of the power storage unit and capable of discharging a current stored in the power storage unit to the downstream side, wherein the calculation unit transmits an operation signal of the discharge to the switch unit when it is determined that the flight object is in a flying state and the circuit is either in the short-circuit state or in the disconnection state.

5. The current generating device according to claim 4, wherein the power storage unit is a capacitor.

6. The current generating device according to claim 4, wherein a physical switch unit that physically turns on/off electrical conduction between the circuit and the switch unit is provided in the circuit.

7. A deployed object ejection device for a flight object mounted on the flight object, the deployed object ejection device comprising:

the current generating device according to claim 5;
a deployed object;
an igniter that operates when a current generated by operation of the current generating device is applied and produces a driving force for ejecting the deployed object; and
a container that encloses the deployed object and the igniter.

8. An airbag device for a flight object mounted on the flight object, the airbag device comprising:
the current generating device according to claim 2
an airbag;
a gas generator that includes an igniter and a gas generating agent and operates when a current generated by operation of the current generating device is applied to the igniter to burn the gas generating agent and generate a gas which inflates the airbag; and
a container that encloses the airbag and the gas generator.

9. A cutting device for a flight object mounted on the flight object, the cutting device comprising:
the current generating device according to claim 4
an electrical conduction unit;
an igniter that operates when a current generated by operation of the current generating device is applied and generates heat or a driving force for cutting off the electrical conduction unit; and
a drive cutting unit that receives the driving force to drive when the igniter generates the driving force.

10. A circuit abnormality diagnosis device that diagnoses a circuit abnormality in a safety device for a flight object including an igniter and a circuit connected to the igniter, the circuit abnormality diagnosis device comprising:
a power supply capable of loading a test voltage to the circuit;
a first overcurrent prevention unit that is electrically connected in series to the power supply and prevents an overcurrent from flowing through the circuit;
a voltage amplification unit that is electrically connected in parallel to the circuit unit and amplifies a voltage;
a calculation unit that controls a switch unit of the power supply, is electrically connected in series to the voltage amplification unit, and reads a value of the voltage amplified by the voltage amplification unit (hereinafter, the voltage value); and
a second overcurrent prevention unit that is electrically connected in series to the voltage reading unit on an upstream side of the voltage reading unit and prevents an overcurrent from flowing,
wherein the calculation unit determines that a case where the voltage value is within a range of a predetermined voltage value V1 or more and V2 or less, which is set in advance as a range of voltage values indicating that the circuit is normal, is a normal state;
a case where the voltage value is less than the voltage value V1 is a short-circuit state in which the circuit is short-circuited; and
a case where the voltage value is higher than the voltage value V2 is a disconnection state in which the circuit is disconnected.

* * * * *